United States Patent
Kim et al.

(10) Patent No.: US 9,184,304 B2
(45) Date of Patent: Nov. 10, 2015

(54) MULTI-SOURCE JFET DEVICE

(71) Applicant: MagnaChip Semiconductor, Ltd., Cheongju-si (KR)

(72) Inventors: Young Bae Kim, Cheongju-si (KR); In Taek Oh, Cheongju-si (KR); Kyung Ho Lee, Cheongju-si (KR); Kwang Il Kim, Cheongju-si (KR)

(73) Assignee: Magnachip Semiconductor, Ltd., Cheongju-si (KR)

(*) Notice: Subject to any disclaimer, the term of this patent is extended or adjusted under 35 U.S.C. 154(b) by 0 days.

(21) Appl. No.: 14/162,561

(22) Filed: Jan. 23, 2014

(65) Prior Publication Data

US 2014/0306270 A1    Oct. 16, 2014

(30) Foreign Application Priority Data

Apr. 12, 2013  (KR) .......... 10-2013-0040395

(51) Int. Cl.
*H01L 29/80* (2006.01)
*H01L 29/808* (2006.01)
*H01L 29/40* (2006.01)
*H01L 29/06* (2006.01)

(52) U.S. Cl.
CPC .......... *H01L 29/808* (2013.01); *H01L 29/0692* (2013.01); *H01L 29/404* (2013.01)

(58) Field of Classification Search
USPC ................. 257/133, 169, 173, 256, 272, 134; 438/186
See application file for complete search history.

(56) References Cited

U.S. PATENT DOCUMENTS

| | | | |
|---|---|---|---|
| 4,143,392 A | | 3/1979 | Mylroie |
| 5,191,401 A | * | 3/1993 | Shirai ................. H01L 27/0922 257/328 |
| 2007/0158681 A1 | * | 7/2007 | Kim et al. ..................... 257/173 |
| 2007/0221963 A1 | * | 9/2007 | Saito et al. .................... 257/256 |

* cited by examiner

*Primary Examiner* — Errol Fernandes
(74) *Attorney, Agent, or Firm* — NSIP Law

(57) ABSTRACT

A junction field-effect transistor (JFET) device is provided. The JFET includes a drain region, a source region, and a junction gate region disposed between the drain region and the source region, and the source region includes two or more source terminals.

14 Claims, 9 Drawing Sheets

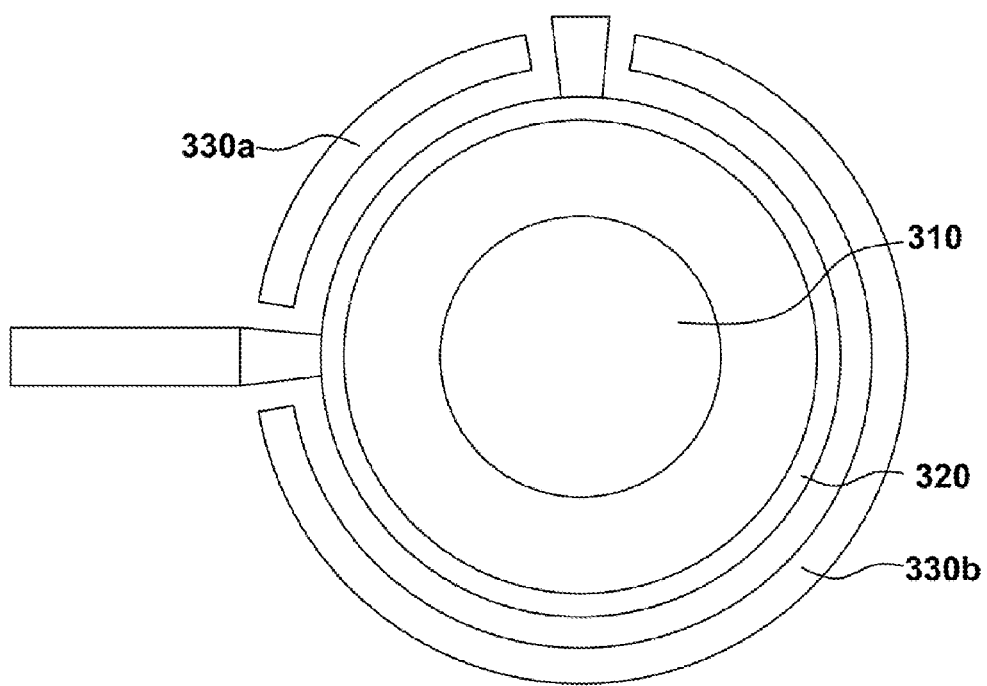

MULTI-SOURCE JFET DEVICE

CROSS-REFERENCE TO RELATED APPLICATIONS

This application claims the benefit under 35 USC 119(a) of Korean Patent Application No. 10-2013-0040395 filed on Apr. 12, 2013, in the Korean Intellectual Property Office, the entire disclosure of which is incorporated herein by reference for all purposes.

BACKGROUND

1. Field

The following description relates to a semiconductor device, and to a multi-source junction gate field-effect transistor (JFET) device having two or more source regions to control and supply a necessary amount of electric current depending on use of an application which is in need of constant electric current supply.

2. Description of Related Art

A voltage control device such as junction gate field-effect transistor (JFET) may function as an electrically-controlled switch when operating in saturation region, while functioning as a voltage control variable resistor when operating in resistive region. The JFET thus provides ideal characteristics for use as a high-input impedance signal source or transimpedance. Further, low current noise and signal distortion characteristics are suitable for audio and high-frequency applications. However, varying input impedance according to temperature, DC performance, or voltage component noise characteristics work as limitation that deters use of JFET amplification application.

The structure of JFET providing the above-mentioned characteristics will be explained below with reference to FIG. 1. FIG. 1 is a schematic plan view of a conventional JFET.

Referring to FIG. 1, a JFET 10 includes a drain region 20 at the center, and a gate region 30 formed around the drain region 20. One source region 40, having a fixed area, is also formed outside the gate region 30.

The JFET 10 also includes a bulk region 50, and a metal 60 connected to the bulk region 50. The JFET 10 is hereinafter referred to as "single-source FET."

The single-source FET 10 illustrated in FIG. 1 will be explained below.

Because the single-source FET 10 has one fixed source region 40, current use is limited. That is, in an application that requires LED be ON constantly, since current is supplied only via one fixed current path, it is not possible to control current amount.

Accordingly, it is necessary to connect a plurality of single-source FETs, when the application needs larger current amount than is provided by a single-source FET 10, which is quite inconvenient.

Furthermore, there is also a burden of having to fabricate new FET with different, suitable structure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a junction field-effect transistor (JFET) device, the JFET device including a drain region, a junction gate region surrounding the drain region, and a source region surrounding the junction gate region and comprising two or more source terminals.

The general aspect of the JFET device may further include a well region disposed below the drain region, the junction gate region and the source region, and the well region below the junction gate region may have a greater depth than the well region below the drain region and the source region.

Silicide may be disposed on the drain region, the junction gate region and the source region.

The general aspect of the JFET device may further include an insulating layer disposed on a surface of a substrate, a barrier layer disposed below the insulating layer, and a plate disposed on the insulating layer to alleviate electric field at a lower region of the barrier layer.

The plate may include polycrystal silicon (Poly-Si) or metal.

The general aspect of the JFET device may further include a source terminal isolating portion that isolates the source terminals from each other.

The source terminal isolating portion may include a region doped with a dopant that is different type from the dopant forming the source terminals.

The source terminal isolating portion may include a body region doped at a first concentration with dopant type different from that of the source terminals, and a well region surrounding the body region and doped at a second concentration that is lower than the first concentration.

The JFET device may be configured to control current amount based on connecting of the source terminals.

The source terminals may be floated when not involved with electric current supply.

The source terminals may have same area or different areas from each other.

In another general aspect, there is provided a junction field-effect transistor (JFET) device, the JFET device including a drain region, a source region, and a junction gate region disposed between the drain region and the source region, and the source region including two or more source terminals.

The source region may have a shape of a circular region disposed above a well region, and the two or more source terminals region may have a shape of an arc in the source region.

The two or more source terminals may be doped with a first conductivity type, and may be separated from each other by source terminal isolating portions that are doped with a second conductivity type.

Other features and aspects will be apparent from the following detailed description, the drawings, and the claims.

BRIEF DESCRIPTION OF THE DRAWINGS

FIG. 6A illustrates a multi-source JFET device with modified structure according to an embodiment.

Figure 1:
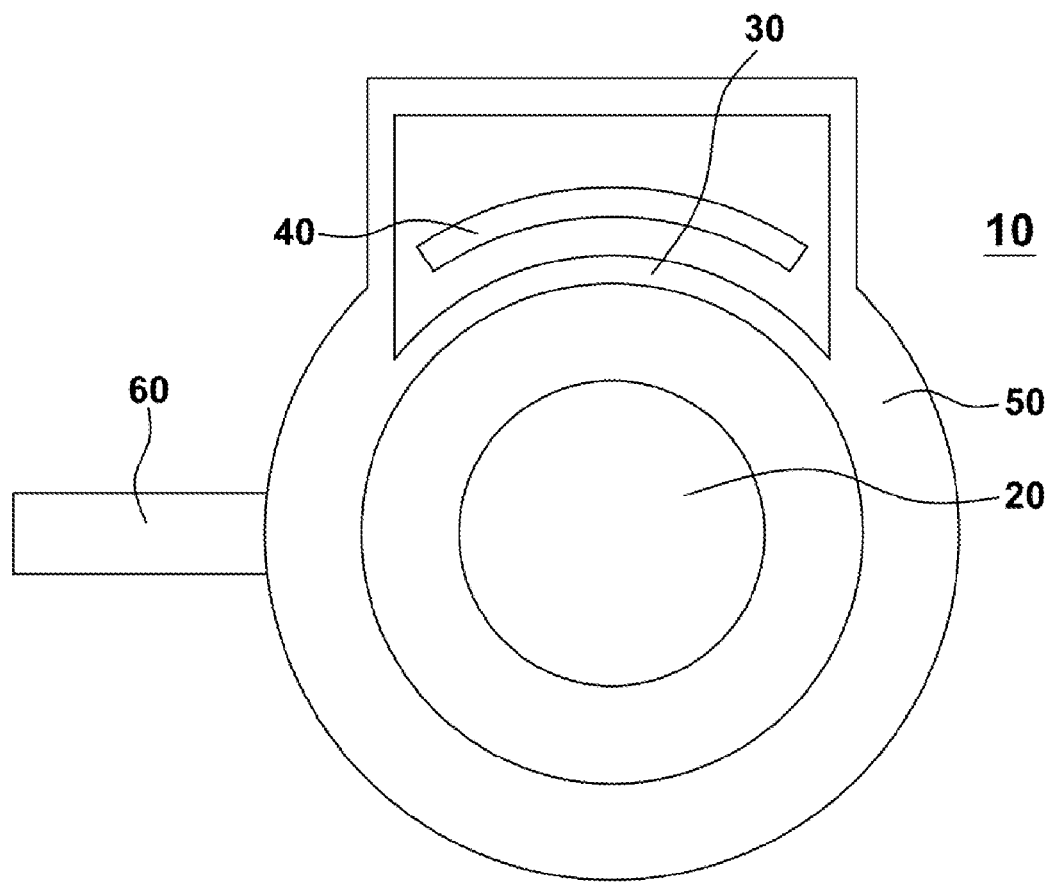
FIG. 1 is a schematic plan view of an example of a single-source FET.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Unless indicated otherwise, a statement that a first layer is "on" a second layer or a substrate is to be interpreted as covering both a case where the first layer is directly contacts the second layer or the substrate, and a case where one or more other layers are disposed between the first layer and the second layer or the substrate.

The spatially-relative expressions such as "below", "beneath", "lower", "above", "upper", and the like may be used to conveniently describe relationships of one device or elements with other devices or among elements. The spatially-relative expressions should be understood as encompassing the direction illustrated in the drawings, added with other directions of the device in use or operation. Further, the device may be oriented to other directions and accordingly, the interpretation of the spatially-relative expressions is based on the orientation.

The expression such as "first conductivity type" and "second conductivity type" as used herein may refer to the conductivity types such as n or p types which are opposed to each other, and an example explained and exemplified herein encompasses complementary examples thereof.

According to one example, the structure of a JFET device is improved so that one JFET has a plurality of current sources and the necessary current is supplied through two or more paths. Such a JFET device may be referred to as a multi-source JFET device.

A multi-source JFET device according to an example will now be explained below with reference to the accompanying drawings. An example of a multi-source JFET device with an improved JFET structure may allow a greater control of current amount depending on a need at one JFET and may supply the current accordingly.

Figure 2:
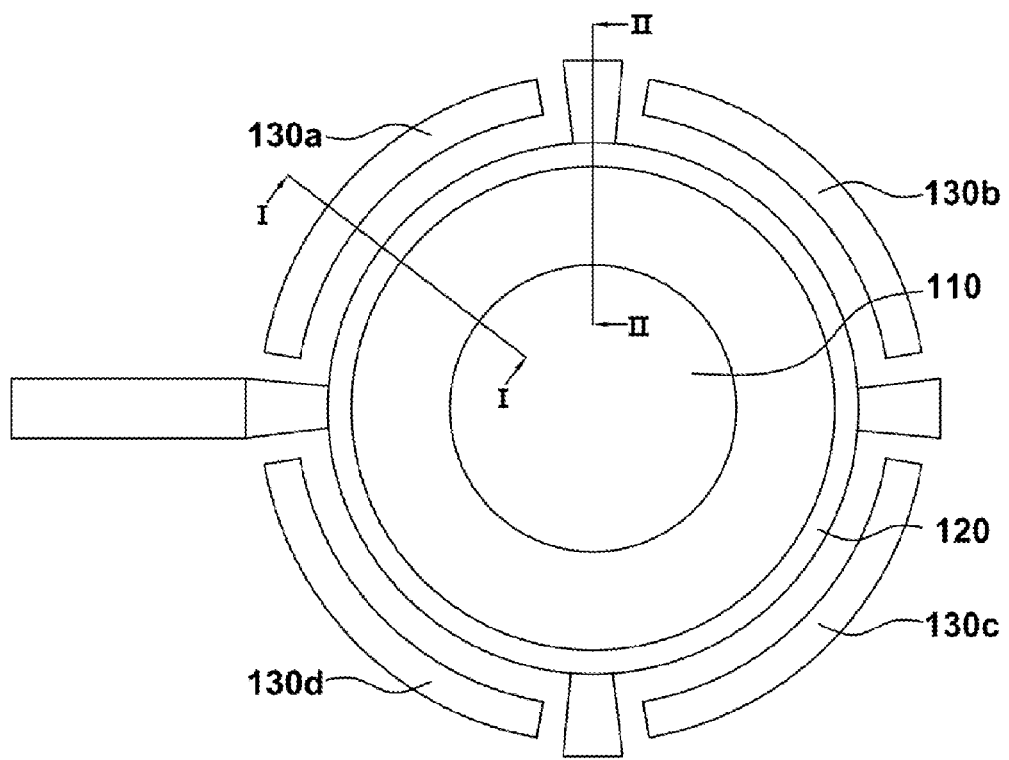
FIG. 2 is a plan view of a multi-source JFET device according to an embodiment.

FIG. 2 is a plan view of a multi-source JFET device according to an embodiment.

Referring to FIG. 2, the multi-source JFET device may have a circular configuration in plan view. An n-type drain region 110 may be located at a center to receive an input current from outside. There may be one drain region 110.

One p-type junction gate 120 may wrap around the drain region 110.

A source region may be formed outside the junction gate 120 to provide a function of providing current path. In one embodiment, the source region may include a total of four source terminals 130a, 130b, 130c, 130d, which may be in uniform size and approximately in the shape of circular-arc. For example, the four source terminals 130a, 130b, 130c, 130d may be arranged as a concentric circle around the junction gate 120. The four source terminals 130a, 130b, 130c, 130d may each have a radial angle of approximately 90°-50°, and may be arranged in symmetry around the drain region 110. Accordingly, the multi-source JFET device may provide four current paths to first to fourth source terminals 130a, 130b, 130c, 130d. The first to fourth source terminals 130a, 130b, 130c, 130d may be selectively used to provide necessary current amounts, as is explained in detail below with reference to FIG. 5.

A cross-sectional view of a multi-source JFET device having the configuration described above will be explained below with reference to FIGS. 3 and 4.

Figure 3:
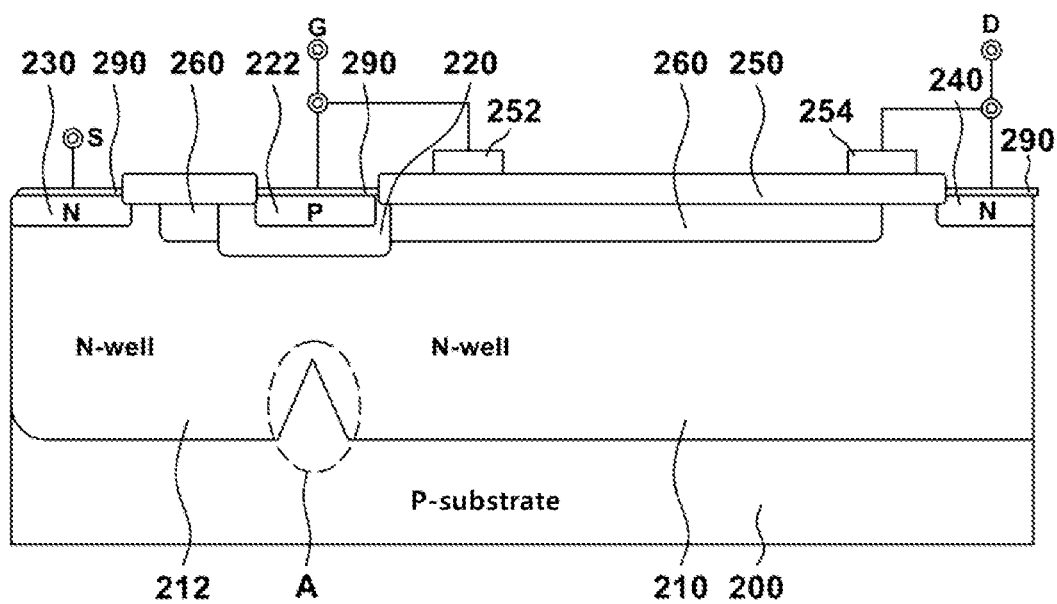
FIG. 3 is a cross-sectional view of the multi-source JFET device of FIG. 2 taken along line I-I.

FIG. 3 is a cross-sectional view of the JFET device of FIG. 2 taken along line I-I of FIG. 2.

Referring to FIG. 3, low-concentration n well regions 210, 212 are formed on a p-type substrate 200.

A p-type body region 220 is formed at a center of the n well regions 210, 212, and a p-type contact region 222, connected to a junction gate electrode G, is formed in the p-type body region 220 playing a role of a junction gate.

Although not illustrated, the n well regions 210, 212 may be isolated from each other initially. Then, as the dopant (impurity) diffuses along the heat treatment in the process of fabrication of multi-source JFET device, and the n well regions 210, 212 are brought into contact with each other, as illustrated in FIG. 3. The contact area (A) between the n well regions 210, 212 has an inward concave shape. Accordingly, the n well regions below the p-type body region 220 (i.e., junction gate) are formed to shorter depth than the other area, such as, for example, p-type barrier layer 260 (which will be explained below) or n-type source region 230, or n-type drain region 240. Since the depth of the n well regions below the p-type body region 220 are shallower than the others, it is advantageous in that the "off" is easily formed in which the p-type body region 220 is extended to a contact with the p-type substrate 200.

A n-type source region 230, connected to a source electrode S, is formed on one side of the p-type body region 220, and a n-type drain region 240, connected to a drain electrode D, is formed on the other side of the p-type body region 220.

An insulating layer, i.e., a LOCOS oxide layer 250 is formed on a surface of the p-type substrate 200 in order to isolate the respective regions from one another. On left and right sides of the p-type body region 220, a p-type barrier layer (p-buried) 260 is formed to reduce resistance of the n well regions 210, 212.

The LOCOS oxide layer 250 includes metal or poly Si plates 252, 254 formed thereon. The metal or poly Si plates 252, 254 provide electric field-alleviating effect with respect to a region below the p-type barrier layer 260. Meanwhile, a silicide layer 290 is formed above the n-type source region 230, the high concentration p-type contact region 222 and the n type drain region 240 to reduce resistance. However, the silicide layer 290 may or may not be formed.

The multi-source JFET device constantly maintains ON state when there is no potential difference between the junction gate G and the source S, and turns to OFF state when the potential difference is generated between the junction gate G and the source S and applied to the point where pinch-off occurs. That is, the current flow is "off" when the area of the p-type body region 220 is extended and brought into a contact with the p-type substrate 200.

Meanwhile, as explained above, in the multi-source JFET device according to an embodiment, one source region may be divided into first to fourth source terminals 130a, 130b, 130c, 130d. In one example, the first to fourth source terminals 130a, 130b, 130c, 130d may be physically isolated from each other, as is illustrated in the cross-sectional view of multi-source JFET device in FIG. 4, taken along line II-II of FIG. 2.

Figure 4:
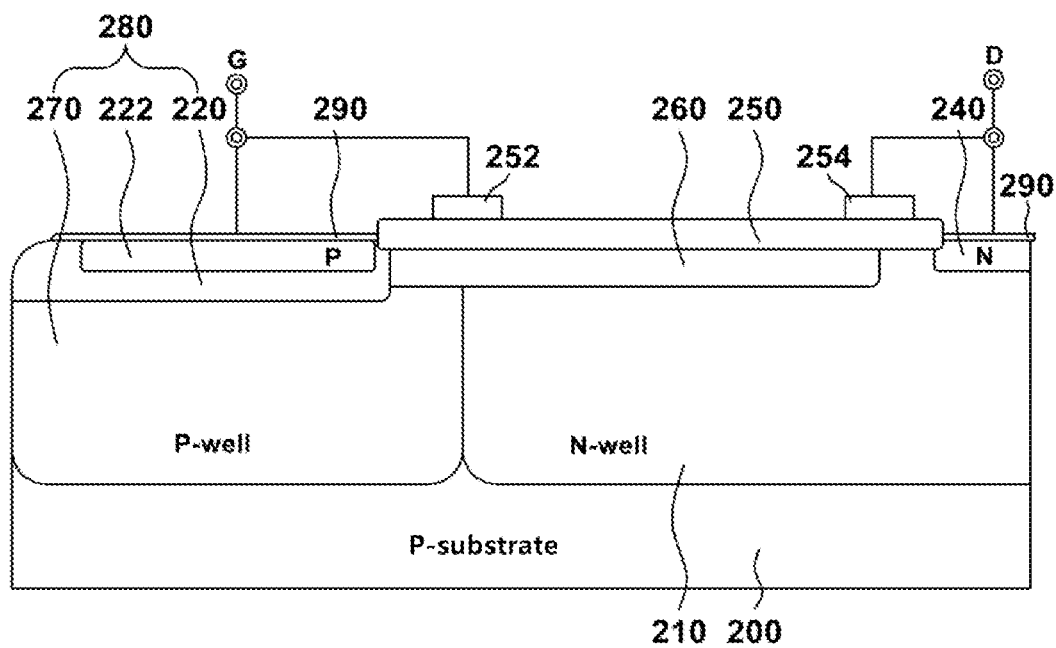
FIG. 4 is a cross-sectional view of the multi-source JFET device of FIG. 2 taken along line II-II.

Referring to FIG. 4, a source terminal dividing portion 280 is formed on the p-type substrate 200. The source terminal dividing portion 280 may be substantially considered to be an extended area of the junction gate region. That is, the source terminal dividing portion 280 may include the p-type body region 220 including the high-concentration p-type contact region 222, and a p well region 270 that is relatively lower concentration and is wrapped around the p-type body region 220.

Accordingly, as the source terminal dividing portion 280 is formed with a different doping type than the source doping type, the source terminal dividing portion 280 isolates the source terminals 130a, 130b, 130c, 130d both physically and electrically.

Referring to FIGS. 5 and 2, an example of operation of multi-source JFET will be explained below. FIGS. 5A to 5E are circuit diagrams provided to explain a process of controlling current amount using the source terminals of the multi-source JFET as illustrated in FIG. 2.

Referring to FIGS. 5A to 5E, reference symbols S1, S2, S3, S4 denote the first to fourth source terminals 130a, 130b, 130c, 130d explained above with reference to FIG. 2.

Figure 5A:
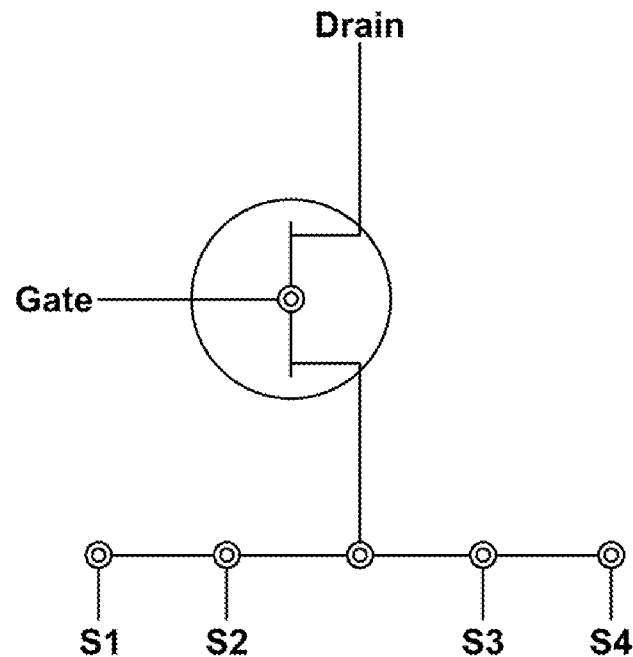
FIGS. 5A to 5E are circuit diagrams illustrating an example of a process of adjusting current amount using a source terminal in the multi-source JFET of FIG. 2.

FIG. 5A illustrates an example in which the first to fourth source terminals 130a, 130b, 130c, 130d are individually connected and used.

Figure 5B:
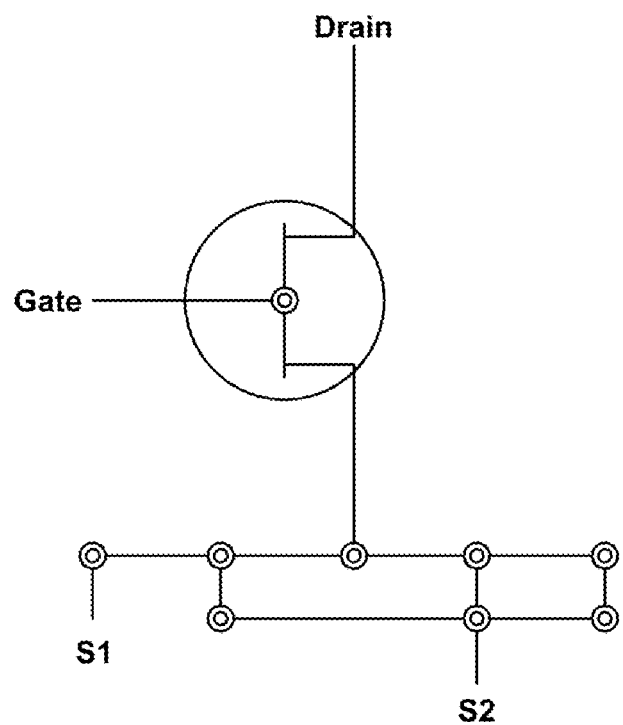
Figure 5C:
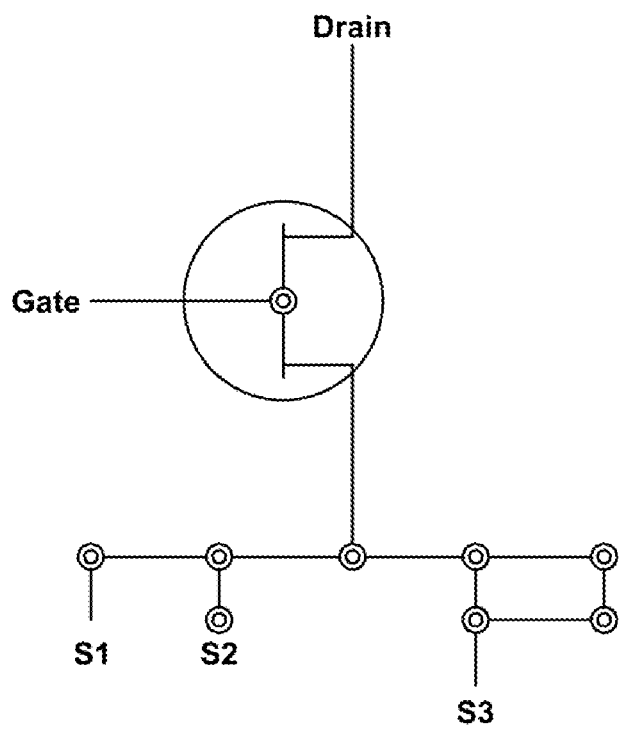

Otherwise, i.e., when current amount of only one source terminal is necessary, or when current amount by two or more source terminals are necessary, corresponding source terminals may be connected to each other. That is, FIG. 5B illustrates an example in which current amount of the first source terminal 130a, and the current amount by the second to fourth source terminals 130b, 130c, 130d are necessary. FIG. 5C illustrates an example in which current amount of the first and second source terminals 130a, 130b, and current amount added with the third and fourth source terminals 130c, 130d, are necessary, respectively.

Figure 5D:
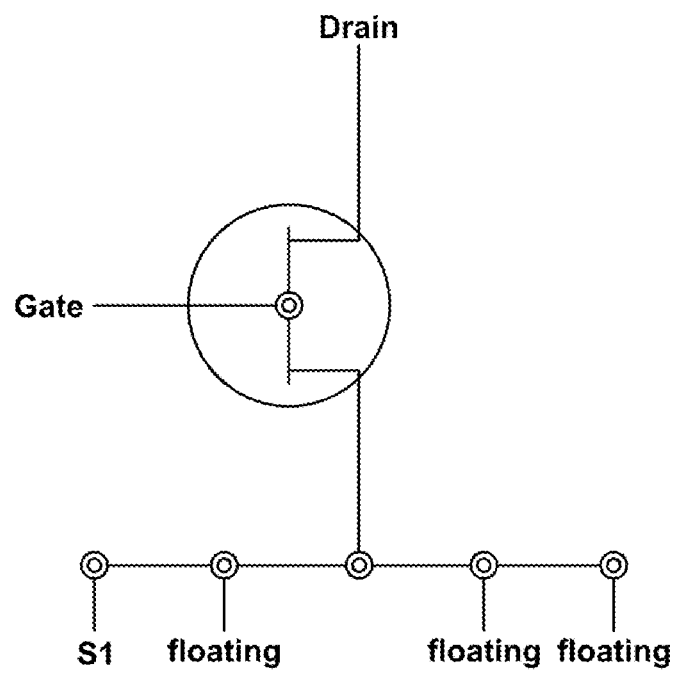

Further, when the current amount of only one source terminal is necessary, referring to FIG. 5D, only the first terminal 130a is connected, while the rest of the source terminals 130b, 130c, 130d are floated. Of course, the number of floated source terminals may vary depending on current amount.

Figure 5E:
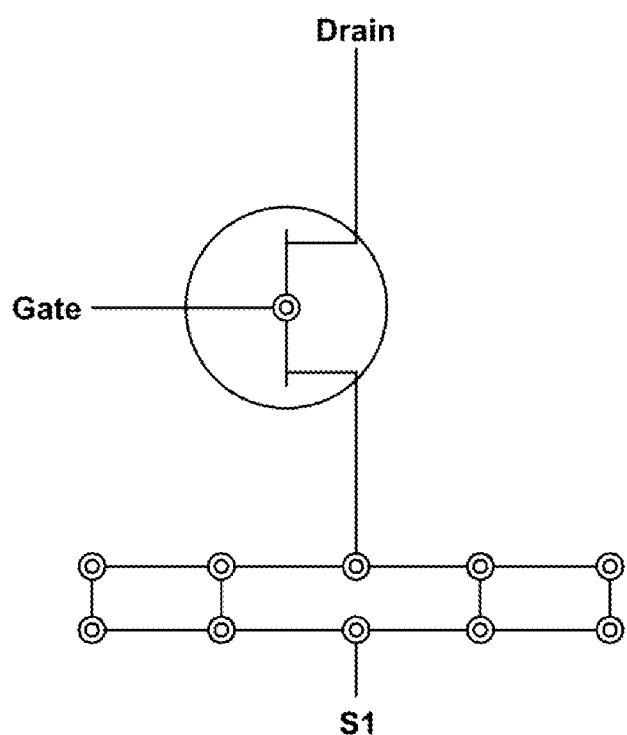

When the current amounts of all the source terminals are necessary, referring to FIG. 5E, all the source terminals, i.e., the first to fourth source terminals 130a, 130b, 130c, 130d are connected.

As explained above, in one embodiment, the multi-source JFET allows adjustment of the current amount, because the one source region that is conventionally present in a JFET device is modified to a plurality of source terminals.

Meanwhile, in one embodiment, the area of the source terminal may vary. This is because the current amount varies in accordance with the area of the source terminal.

FIG. 6 illustrates examples of various structures of multi-source JFET device.

Referring to FIG. 6A, there is one drain region 310 at the center of the JFET device in order to receive input power from outside, and one junction gate region 320 surrounds the drain region 310.

Outside the junction gate region 320, a source region is formed to provide a path of currents. The source region may be formed by a first source terminal 330a and a second source terminal 330b. The second source terminal 330b may have a larger area (approximately three times larger area) than that of the first source terminal 330a. For example, the first source terminal 330a and a second source terminal 330b may be arranged as a concentric circle around the junction gate region 320. The first source terminal 330a may have a radial angle of approximately 90°-70°. The second source terminal 330b may have a radial angle of approximately 270°-250°. Accordingly, the current ratio between the first and second source terminals 330a, 330b is 1:3, and necessary current amount can be provided easily.

Figure 6B:
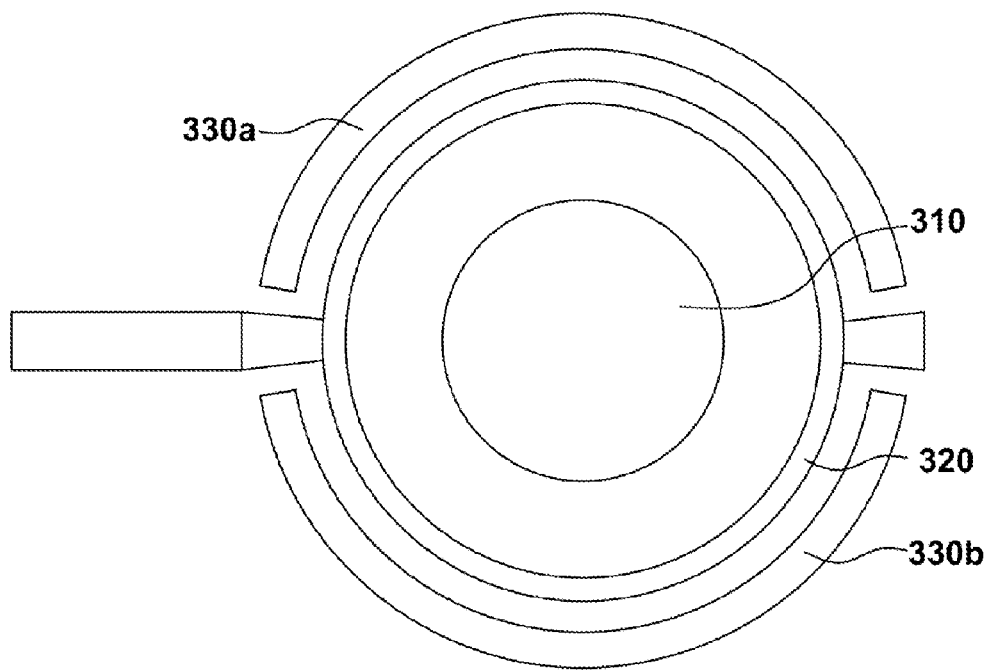
FIG. 6B illustrates a multi-source JFET device with modified structure according to another embodiment.

FIG. 6B illustrates an example in which two source terminals, i.e., the first and second source terminals 330a, 330b, are formed, with the same area to each other. For example, the first source terminal 330a and a second source terminal 330b each have a radial angle of approximately 180°-160°. However, the arrangement of the source terminals are provided as an example only, and in other examples, various different radial angles, shapes and symmetry may be used for the source terminals. Referring to FIG. 6B, in comparison to the arrangement of the source terminals 130a, 130b, 130c, 130d illustrated in FIG. 2, the first and second source terminals 130a, 130b are connected to each other, and the third and fourth source terminals 130c, 130d are connected to each other to provide improved current amounts in FIG. 6B. Thus, in FIG. 6B, the current amount of the first and second source terminals 330a, 330b with significantly increased areas, is used.

Meanwhile, the source terminals illustrated and described so far are one of examples. Accordingly, five or more source terminals may be formed depending on current amount as required, and the source terminals may be identical to or different from each other in size.

As explained above, according to various embodiments, a plurality of source terminals may be formed in one JFET device, and the areas of the source terminals may vary from each other depending on the current amounts as required. As a result, one JFET device can provide a plurality of current sources.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A junction field-effect transistor (JFET) device, comprising:
   a drain region;
   a junction gate region surrounding the drain region; and
   a plurality of source regions surrounding the junction gate region.

2. The JFET device of claim 1, further comprising a well region disposed below the drain region, the junction gate region and the plurality of source regions,
   wherein the well region below the junction gate region has a greater depth than the well region below the drain region and the plurality of source regions.

3. The JFET device of claim 2, wherein silicide is disposed on the drain region, the junction gate region and the plurality of source regions.

4. The JFET device of claim 2, further comprising:
   an insulating layer disposed on a surface of a substrate;
   a barrier layer disposed below the insulating layer; and
   a plate disposed on the insulating layer to alleviate electric field at a lower region of the barrier layer.

5. The JFET device of claim 4, wherein the plate comprises polycrystal silicon (Poly-Si) or metal.

6. The JFET device of claim 1, further comprising a source region isolating portion that isolates the plurality of source regions from each other.

7. The JFET device of claim 6, wherein the source region isolating portion comprises a region doped with a dopant that is different type from the dopant forming the source terminals.

8. The JFET device of claim 6, wherein the source region isolating portion comprises a body region doped at a first concentration with dopant type different from that of the plurality of source regions, and a well region surrounding the body region and doped at a second concentration that is lower than the first concentration.

9. The JFET device of claim 6, wherein the JFET device is configured to control current amount based on connecting of the plurality of source regions.

10. The JFET device of claim 9, wherein the plurality of source regions are floated when not involved with electric current supply.

11. The JFET device of claim 6, wherein the plurality of source regions have same area or different areas from each other.

12. A junction field-effect transistor (JFET) device, comprising a drain region, a plurality of source regions, and a junction gate region disposed between the drain region and the plurality of source regions.

13. The JFET device of claim 12, wherein the plurality of source regions has a shape of a circular region disposed above a well region; and the plurality of source regions have a shape of an arc.

14. The JFET device of claim 12, wherein the plurality of source regions are doped with a first conductivity type, and are separated from each other by source region isolating portions that are doped with a second conductivity type.

* * * * *